US007525391B2

(12) United States Patent  (10) Patent No.: US 7,525,391 B2
Denoyer  (45) Date of Patent: Apr. 28, 2009

(54) LINEAR TRANSIMPEDANCE AMPLIFIER WITH MULTIPLEXED GAIN STAGE

(75) Inventor: Gilles P. Denoyer, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 57 days.

(21) Appl. No.: 11/842,586

(22) Filed: Aug. 21, 2007

(65) Prior Publication Data
US 2008/0284522 A1    Nov. 20, 2008

Related U.S. Application Data

(60) Provisional application No. 60/938,553, filed on May 17, 2007.

(51) Int. Cl.
*H03F 3/08* (2006.01)
(52) U.S. Cl. .................................. 330/308; 330/85
(58) Field of Classification Search ................. 330/308, 330/85, 110; 250/214 A, 214 AG
See application file for complete search history.

(56) References Cited

U.S. PATENT DOCUMENTS

| | | | |
|---|---|---|---|
| 5,012,202 A | 4/1991 | Taylor | |
| 5,459,311 A | 10/1995 | Brosnan | |
| 5,646,573 A | 7/1997 | Bayruns et al. | |
| 5,815,051 A | 9/1998 | Hamasaki et al. | |
| 6,239,659 B1 | 5/2001 | Grassle | |
| 6,297,701 B1 | 10/2001 | Visocchi et al. | |
| 6,404,281 B1 | 6/2002 | Kobayashi | |
| 6,771,132 B1 | 8/2004 | Denoyer et al. | |
| 6,778,021 B2 | 8/2004 | Denoyer et al. | |
| 6,844,784 B1 | 1/2005 | Denoyer et al. | |
| 6,847,263 B2 | 1/2005 | Denoyer et al. | |
| 6,879,217 B2 * | 4/2005 | Visocchi | 330/308 |
| 7,030,702 B2 | 4/2006 | Denoyer et al. | |
| 7,092,644 B2 | 8/2006 | Davidson | |
| 2003/0142929 A1 | 7/2003 | Barthur et al. | |
| 2004/0124927 A1 | 7/2004 | Jung et al. | |
| 2006/0034621 A1 | 2/2006 | Denoyer | |

OTHER PUBLICATIONS

Design on Integrated Circuits for Optical Communications, Behzad Razavi, McGraw Hill, ISBN 0-07-122972-8.

* cited by examiner

*Primary Examiner*—Robert Pascal
*Assistant Examiner*—Hieu P Nguyen
(74) *Attorney, Agent, or Firm*—Workman Nydegger

(57) ABSTRACT

A linear transimpedance amplifier includes a forward transimpedance circuit that receives an input signal from an optical device. The forward transimpedance circuit generates a linear output signal. The forward transimpedance circuit includes a first gain path and a second gain path, the first gain path configured to amplify the input signal when the first gain path is at a lower input impedance relative to the second gain path and the second gain path configured to amplify the input signal when the second gain path is at a lower input impedance relative to the first gain path. A feedback circuit includes a first circuit that detects a low frequency component of the output signal. The feedback circuit further includes a second circuit that is driven by the low frequency component of the output signal and is connected with the forward transimpedance circuit such that the second circuit uses an average optical device current to at least partially control when the input signal is amplified by the first gain path and when the input signal is amplified by the second gain path.

20 Claims, 5 Drawing Sheets

LINEAR TRANSIMPEDANCE AMPLIFIER WITH MULTIPLEXED GAIN STAGE

CROSS-REFERENCE TO RELATED APPLICATIONS

This application claims the benefit of U.S. Provisional Application No. 60/938,553, filed May 17, 2007, which is incorporated herein by reference in its entirety.

BACKGROUND

Fiber optic networks use light signals to transmit data over a network. Although light signals are used to carry data, the light signals are typically converted into electrical signals in order to extract and use the data. The conversion of an optical signal into an electrical signal is often achieved utilizing a fiber optic receiver. A fiber optic receiver converts the optical signal received over the optical fiber into an electrical signal, amplifies the electrical signal, and converts the electrical signal into an electrical digital data stream.

The fiber optic receiver usually includes a photodiode that detects the light signal and converts the light signal into an electrical signal or current. A transimpedance amplifier amplifies the signal from the photodiode into a relatively large amplitude electrical signal. The amplified electrical signal is then converted into a digital data stream.

The optical signals that are converted into electrical signals by the fiber optic a receiver, however, can vary significantly in both amplitude and power. The power of the optical signal is often related, for example, to the length of the optical fiber over which the optical signal was received, the laser source, etc. These and other factors result in optical signals whose incident power at the transimpedance amplifier can vary significantly.

Fiber optic receivers are only able to successfully receive and amplify optical signals that fall within a particular power range. In order for a fiber optic receiver to accommodate a wide range of optical signals, the fiber optic receiver and in particular, the transimpedance amplifier (TIA), should be able to detect and amplify very low levels of optical power as well as high levels of optical power. The range of signals that can be successfully amplified is therefore effectively limited by the incident optical power because the fiber optic receiver distorts or clamps signals whose optical power is too large and cannot recognize signals whose optical power is too low due to noise limitations of the receiver.

In some applications, especially those applications at high optical power and high speed such as 10 Gigabits/second, it is undesirable for signal distortion or clamping to occur. For example, optical transceiver modules have begun to implement Electronic Dispersion Compensation (EDC) to extend the reach of transmission over legacy multimode fiber at high data rate. These multimode fibers can vary significantly in their frequency response and exhibit limited bandwidth and high dispersion. The 10GBASE-LRM standard is one of the first standards for fiber optic transceivers to use adaptive equalizers to compensate for non-ideal fiber channel frequency response. However, the equalization of a linear transmission channel and the implementation of EDC requires the TIA to be linear within a large incident optical power.

At low optical power, a TIA will usually operate in a linear fashion as there is not enough optical power to cause the transistors and other components of the transimpedance amplifier to saturate or otherwise cause non-linear signal distortion. At high optical power, however, saturation may occur with corresponding non-linear signal distortion.

Accordingly, several solutions have been implemented to provide for a linear TIA at high optical power and high speed. For example, referring to FIG. 1, one common solution is illustrated. FIG. 1 illustrates a TIA 10 coupled to a photodiode 15. Modulation current is received by a forward gain stage 11 and a shunt feedback resistor 12. The signal is then provided to a second gain stage 13 for further amplification. A feedback loop and amplifier 14 is used to sense an average photodiode current to determine the optical power received by photodiode 15. The shunt feedback resistor 11 may then be adjusted as needed to maintain the gain of TIA 10 in a linear fashion. However, the need to continually adjust shunt feedback resistor 11 as the average optical power changes can cause TIA 10 to become unstable, its bandwidth to increase and thus produce unwanted additional noise, peaking and potential non-linear signal distortion. Accordingly, the TIA of FIG. 1 requires special attention for high optical power application and is not a good candidate for linear amplification without special additional circuit implementation.

Another common solution is illustrated by FIG. 2. FIG. 2 illustrates a TIA 20 coupled to a photodiode 25. Modulation current is received by a forward gain stage 21 and a shunt feedback resistor 22. The signal is then provided to a second gain stage 23 for further amplification. A peak detector or full wave rectifier 24 is used to sense the amplitude of an output signal. The shunt feedback resistor 22 may then be adjusted to change the gain of the forward gain stage 21 such that the amplitude of the output signal stays constant. This is a typical implementation of an automatic gain control (AGC) circuit for a TIA. However, it is often difficult to implement a peak detector or full wave rectifier at speeds of 10 Gigabits/second or higher. Further, the need to change shunt feedback resistor 22 may cause the stability problems discussed in relation to FIG. 1. Finally, AGC does not necessarily guarantee the linearity of the amplifier. Accordingly, the simple TIA architecture of FIG. 2 is also not suited for linear optical to electrical conversion and amplification. Additional circuits may be required to meet linearity requirements.

BRIEF SUMMARY

The embodiments disclosed herein relate to linear transimpedance amplifiers (TIA) that are configured to provide linear amplification of the input photodiode current signal. A first embodiment discloses a linear transimpedance amplifier with two or more gain paths. The linear transimpedance amplifier includes a first stage transimpedance circuit that receives an input signal from an optical device that converts an optical signal to the input signal. The first stage transimpedance circuit generates a linear output signal. The transimpedance amplifier circuit includes a first gain path and a second gain path, the first gain path configured to amplify the input signal when the first gain path is at a lower TIA input impedance relative to the second gain path and the second gain path configured to amplify the input signal when the second gain path is at a lower input impedance relative to the first gain path.

The linear transimpedance amplifier of the first embodiment also includes a feedback circuit that includes a first circuit that detects a low frequency component of the output signal. The feedback circuit further includes a second circuit that is driven by the low frequency component of the output signal and is connected with the forward transimpedance circuit such that the second circuit uses an average optical device current to at least partially control when the input signal is amplified by the first gain path and when the input signal is amplified by the second gain path.

A second embodiment of the present invention discloses a linear transimpedance amplifier comprising an input stage that receives an input current signal from an optical device that converts an optical signal to the input current signal. The input stage includes at least a first gain path that generates a first output voltage from the input current signal and a second gain path that generates a second output voltage from the input current signal. The first gain path generates the first output voltage when the first gain path is at a lower input impedance relative to the second gain path and the second gain path generates the second output voltage when the second gain path is at a lower input impedance relative to the first gain path.

The transimpedance amplifier further includes a multiplexed gain stage. The multiplexed gain stage includes at least a first amplifier stage configured to amplify the first output voltage to produce a first amplified signal and a second amplifier stage configured to amplify the second output voltage to produce a second amplified signal.

The transimpedance amplifier also includes a feedback circuit that includes a first circuit that detects a low frequency component of the first and/or second amplified signals. The feedback circuit also includes a second circuit that is driven by the low frequency component of the output signal and is connected with the input stage such that the second circuit uses an average optical device current to at least partially control when first gain path generates the first output voltage and when the second gain path generates the second output voltage.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows, and in part will be obvious from the description, or may be learned by the practice of the embodiments disclosed herein. The features and advantages of the embodiments disclosed herein may be realized and obtained by means of the instruments and combinations particularly pointed out in the appended claims. These and other features of the embodiments disclosed herein will become more fully apparent from the following description and appended claims, or may be learned by the practice of the embodiments disclosed herein as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Figure 1:
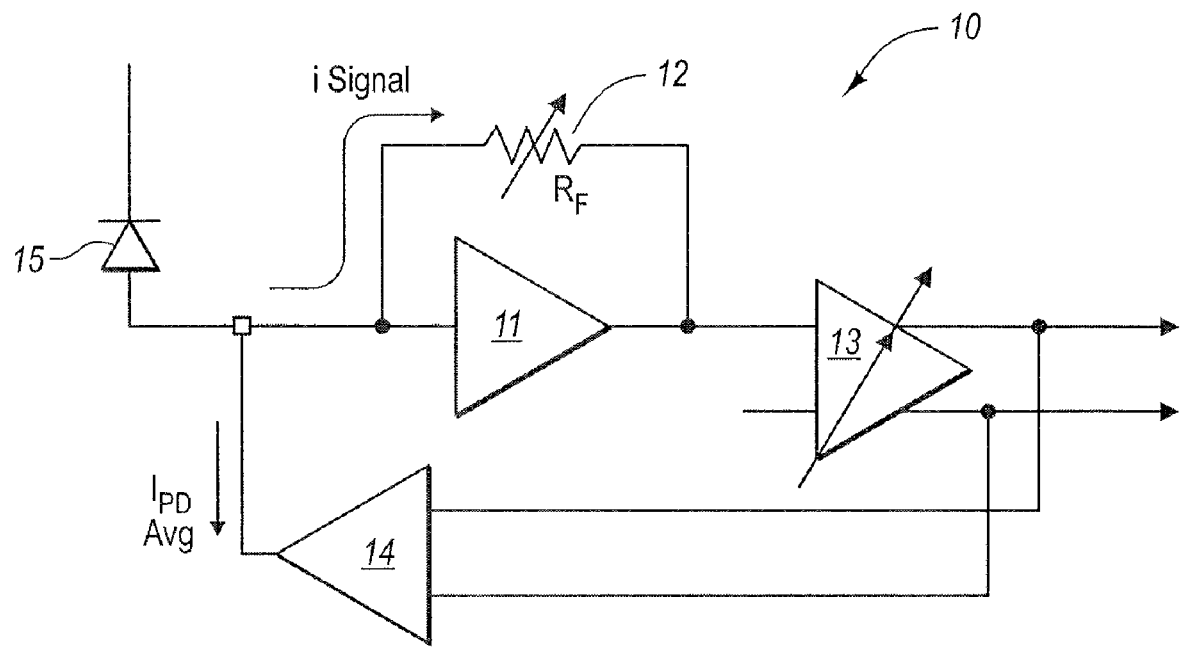
FIG. 1 illustrates one example of a transimpedance amplifier in accordance with the prior art.
Figure 2:
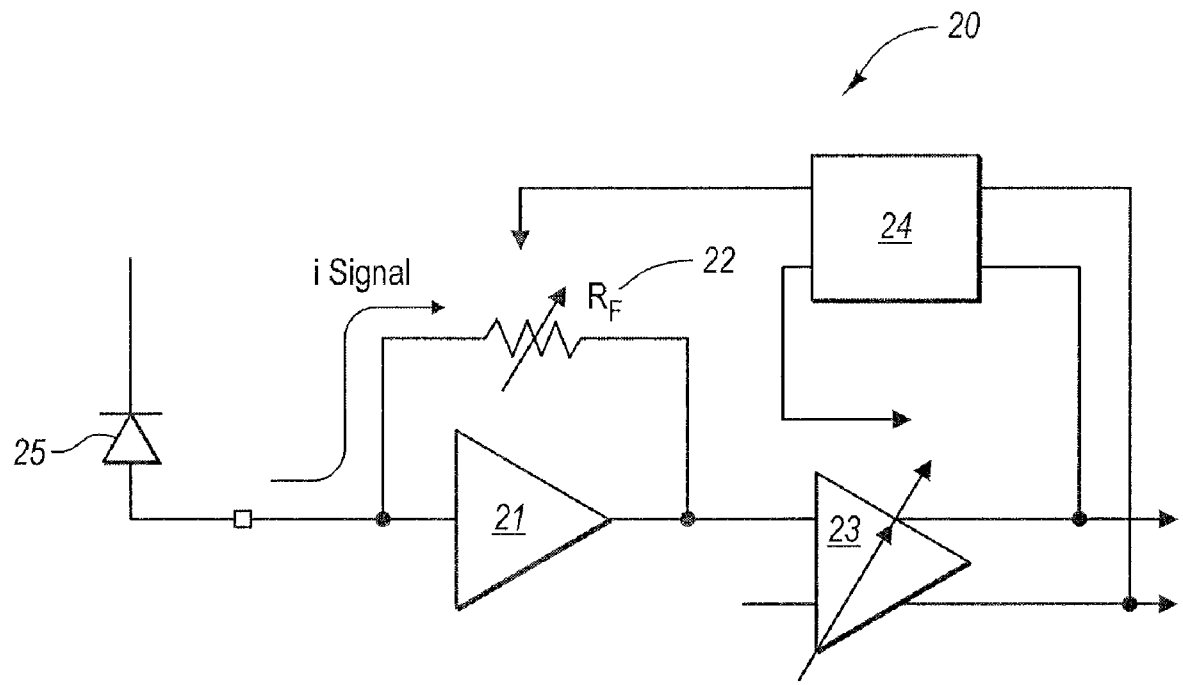
FIG. 2 illustrates another example of a transimpedance amplifier in accordance with the prior art.

The embodiments disclosed herein relate to linear transimpedance amplifiers (TIA) that are configured to provide linear amplification of the input photodiode current signal. A first embodiment discloses a linear transimpedance amplifier with two or more gain paths. The linear transimpedance amplifier includes a first stage transimpedance circuit that receives an input signal from an optical device that converts an optical signal to the input signal. The first stage transimpedance circuit generates a linear output signal. The transimpedance amplifier circuit includes a first gain path and a second gain path, the first gain path configured to amplify the input signal when the first gain path is at a lower TIA input impedance relative to the second gain path and the second gain path configured to amplify the input signal when the second gain path is at a lower input impedance relative to the first gain path.

The linear transimpedance amplifier of the first embodiment also includes a feedback circuit that includes a first circuit that detects a low frequency component of the output signal. The feedback circuit further includes a second circuit that is driven by the low frequency component of the output signal and is connected with the forward transimpedance circuit such that the second circuit uses an average optical device current to at least partially control when the input signal is amplified by the first gain path and when the input signal is amplified by the second gain path.

A second embodiment of the present invention discloses a linear transimpedance amplifier comprising an input stage that receives an input current signal from an optical device that converts an optical signal to the input current signal. The input stage includes at least a first gain path that generates a first output voltage from the input current signal and a second gain path that generates a second output voltage from the input current signal. The first gain path generates the first output voltage when the first gain path is at a lower input impedance relative to the second gain path and the second gain path generates the second output voltage when the second gain path is at a lower input impedance relative to the first gain path.

The transimpedance amplifier further includes a multiplexed gain stage. The multiplexed gain stage includes at least a first amplifier stage configured to amplify the first output voltage to produce a first amplified signal and a second amplifier stage configured to amplify the second output voltage to produce a second amplified signal.

The transimpedance amplifier also includes a feedback circuit that includes a first circuit that detects a low frequency component of the first and/or second amplified signals. The feedback circuit also includes a second circuit that is driven by the low frequency component of the output signal and is connected with the input stage such that the second circuit uses an average optical device current to at least partially control when first gain path generates the first output voltage and when the second gain path generates the second output voltage.

Turning now to the drawings, in which several similar reference characters denote similar elements throughout, FIGS. 3-7 illustrate various aspects of embodiments of the present invention. It is to be understood that the drawings are diagrammatic and schematic representations of the embodiments disclosed herein, and are not limiting of the present invention, nor are they necessarily drawn to scale. It is also to be understood that the use of the terms "first", "second", and so forth to describe two or more elements in this description and in the claims is for the purpose of distinguishing the elements from one another and is not meant to imply sequential ordering unless explicitly stated. It is also to be understood in this description and in the claims that two elements or components are coupled or connected to each other if they are either directly coupled or connected to each other or are coupled or connected together through one or more intervening elements or components.

Figure 3:
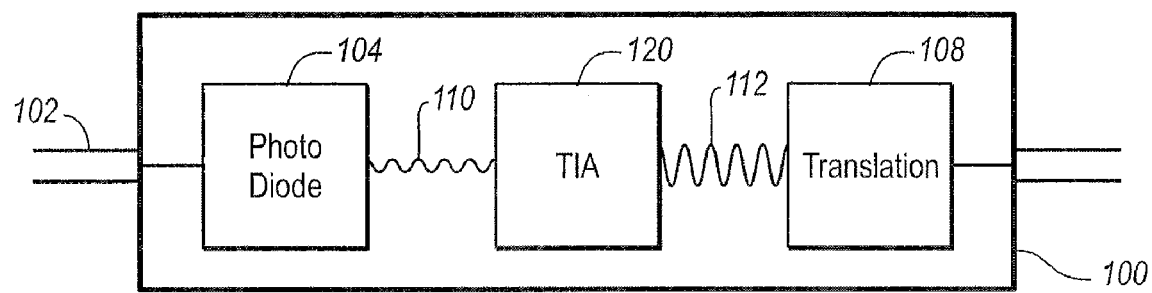
FIG. 3 illustrates one embodiment of an optical receiver that includes an integrated transimpedance amplifier.

FIG. 3 illustrates an exemplary environment for implementing embodiments of the present invention. FIG. 3 illustrates a fiber optic receiver 100 that receives an optical signal (light) and converts the optical signal to an electrical signal or data stream (usually represented as a voltage). The fiber optic receiver 100 receives an optical signal 103 over an optical fiber 102. A photodiode 104 or other optical device that converts an optical signal to an electrical signal or current receives the optical signal and generates an electrical signal 110 (current).

The TIA 120 amplifies the electrical signal 110 to produce the amplified electrical signal 112. The TIA 120 has a wide dynamic range that is able to amplify signals with large power without significantly diminishing the ability to amplify signals with low power. The amplified electrical signal 112 is then amplified by a post amplifier with AGC 108 or is operated on by another integrated circuit such as a clock and data recovery circuit and/or equalizer.

Figure 4:
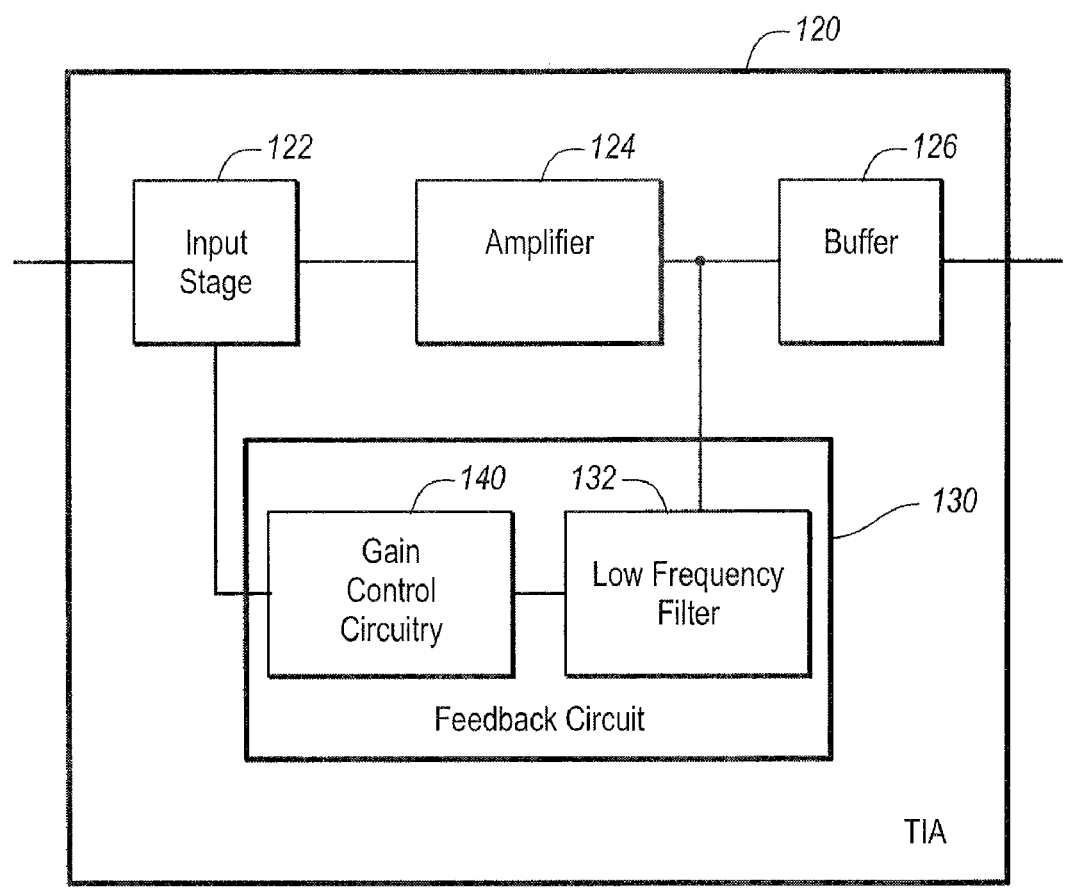
FIG. 4 is a block diagram of a transimpedance amplifier in accordance with the principles of the present invention.

FIG. 4 illustrates a block diagram of an exemplary linear transimpedance amplifier (TIA) in accordance with the present invention. The linear TIA 120 includes an input stage 122 that receives an electrical signal 110 from a photo diode or other device that converts an optical signal into the electrical signal. An amplifier 124 amplifies the electrical signal and helps reduce or prevent noise from being a factor. A buffer 126 is also optionally provided at the output of the linear TIA 120. In one embodiment, the input stage 122 and the amplifier 124 are referred to as a forward transimpedance circuit. It is understood by one of skill in the art that the input stage 122 and the amplifier 124 can be implemented in different configurations. An exemplary configuration includes, but is not limited to, a common base configuration. In addition, the amplifier 124 includes single ended amplification, differential amplification, and the like or any combination thereof. Note that in some embodiments, input stage 122 and amplifier stage 124 may be the same stage.

In some embodiments, input stage 122 may consist of two or more gain paths. In addition, amplifier stage 124 may be multiplexed and consist of two or more amplifier stages. In such embodiments, the use of the two or more gain paths and/or amplifier stages helps to preserve the linearity of the signal output by TIA 120. For example, a first gain path and/or amplifier stage may be used to amplify the input signal from the photodiode at low optical power levels. As the received optical power levels increase, saturation or other signal distortion may occur that adversely impacts the linearity of TIA 120. Accordingly, a second gain path and/or amplifier stage may be used to amplify the input signal from the photodiode at high optical power levels to at least partially prevent non-linear signal distortion.

The feedback circuit 130 provides both gain control and direct current (DC) cancellation for the linear TIA amplifier 120. In the feedback circuit 130, a low frequency filter 132 is used to detect the DC component output by the amplifier 124. The DC component or low frequency component of the output of the amplifier 124 is passed by the low frequency filter 132 and is canceled by the circuit 140. In another embodiment, the low frequency filter 132 may be replaced with a peak detector or similar circuitry.

The gain control circuitry 140 also provides gain control for the linear TIA 120. In operation, the gain control circuitry is configured to use an average current of the photodiode or other optical component to control the gain in the input stage 122 and/or amplifier 124 that is detected by feedback loop 130. The gain control is typically accomplished by using the average current to switch on and off one or more gain paths in the input stage 122 and/or amplifier 124 as will be explained in more detail to follow. This is advantageous for the linear TIA 120 because the range of signals that can be amplified without clipping, saturation, or other problems, is increased.

Figure 5:
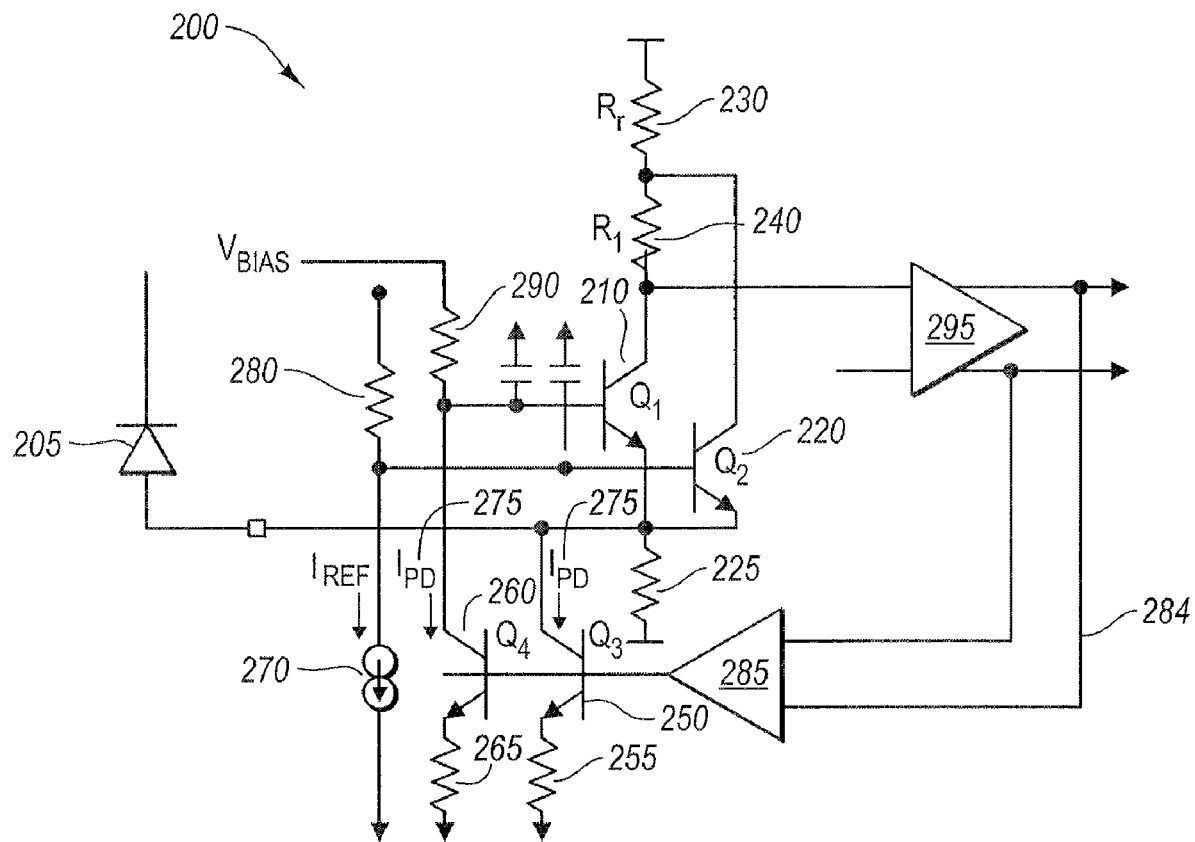
FIG. 5 is a block diagram of a transimpedance amplifier in accordance with the principles of the present invention.

FIG. 5 illustrates one embodiment of a linear TIA 120 designated as linear transimpedance amplifier (TIA) 200. The linear TIA 200 of FIG. 5 utilizes a common base topography with a feedback circuit that provides DC cancellation as previously described. Generally, the linear TIA 200 includes an amplifier that may include one or more stages. The DC offset or component is sensed by the feedback and eliminated from the input signal. Advantageously, this helps to control the gain linear TIA 200, particularly an input stage of the linear TIA 200.

As illustrated in FIG. 5, transistors 210 and 220 comprise an input stage of linear transimpedance amplifier 200. A base terminal of transistor 210 (Q1) is connected to Vbias through a resistor 290. Note that in some embodiments a capacitor may be coupled to the base as needed. The base terminal is also connected to a collector terminal of a transistor 260 (Q4). The collector terminal of transistor 210 is connected to a resistor 240 (R1), which is in turn connected in series to a resistor 230 (R2). The collector terminal is also connected to an input to amplifier 295. The emitter terminal of transistor 210 is coupled to a photodiode 205 and to a resistor 225. The emitter is also connected to a collector terminal of a transistor 250 (Q3).

As further illustrated, the base terminal of transistor 220 (Q2) is connected to Vbias through a resistor 280. Note that in some embodiments a capacitor may be coupled to the base as needed. The base terminal is also connected to a fixed reference current Iref 270. The collector terminal of transistor 220 is connected between the resistors 230 and 240 and to the input of the amplifier 295. The emitter terminal of transistor 220 is connected to the photodiode 205 and the resistor 225. The emitter is also connected to a collector terminal of transistor 250. Note that as illustrated, transistors 210 and 220 form a differential pair.

Referring again to FIG. 5, transistors 250 and 260, which may correspond to gain control circuitry 140, along with amplifier 285, which may correspond to low frequency filter or component 130, form a DC cancellation feedback loop 284, which may correspond to feedback loop 130. As illustrated, a base terminal of transistor 250 is coupled to the output of amplifier 285. An emitter terminal is coupled to ground through a resistor 255. The collector terminal is connected as previously described.

In similar manner, a base terminal of transistor 260 is coupled to the output of amplifier 285. An emitter terminal is coupled to ground through a resistor 265. The collector terminal is connected as previously described. Advantageously, by implementing transistors 250 and 260 as equal values and by implementing resistors 255 and 265 as equal values, the current through transistor 250 may be mirrored by the current through transistor 260 as will be explained in more detail to follow.

Having described the structure of linear TIA 200, its operation will now be explained. When no current is being received from photodiode 205, the voltage at the base of transistor 210 is equal to Vbias while the current at the base of transistor 220 is equal to Vbias−(Iref 270)×(resistor 280). At low optical power, modulation current received from photodiode 205 begins to flow through transistor 210 and gets amplified as photodiode modulation current Imod×(resistor 230+resistor 240). This signal is then provided to amplifier 295 for further amplification.

As shown, the signal output from amplifier 295 is monitored by DC cancellation feedback loop 284. In operation, amplifier 285 causes the average photodiode current, Ipd 275, to be sunk by transistor 250. Ipd 275 is proportional to the average optical power and is advantageously used by linear TIA 200 to control the gain of the input stage.

As mentioned previously, transistor 260 is configured to mirror the average photodiode current Ipd 275 in transistor 250. The current Ipd 275 is then fed to the base terminal of transistor 210. As a result, the voltage at the base of transistor 210 becomes Vbias−(Ipd 275)×(resistor 290). As long as the optical power remains low, transistor 210 will provide a path of less impedance (i.e., will have a lower input impedance) and the current will flow through transistor 210 and be amplified as described.

As the optical power begins to rise, the amplitude of Ipd 275 also will rise since Ipd 275 is proportional to the average optical power as previously described. The increasing amplitude of Ipd 275 will in turn cause the input impedance of the signal path through transistor 210 to rise. Accordingly, at the point in time when Ipd 275 is equal to Iref 270, the voltage at the base of transistors 210 and 220 is balanced, each having equal input impedance. When Ipd 275 becomes larger than Iref 270, the signal path including transistor 220 will have less input impedance, thus causing the modulation current from photodiode 205 to flow through transistor 220.

As can be seen from FIG. 5, the current flowing through transistor 220 is amplified as Imod×resistor 230 before being provided to amplifier stage 295. In other words, resistor 240 does not contribute to the amplification. Advantageously, this helps to maintain the linearity of TIA 200 by at least partially removing resistor 240 from the signal path. Accordingly, any signal impurities caused by resistor 240 that may add harmonics to the output of transimpedance amplifier 200 are reduced.

Figure 6:
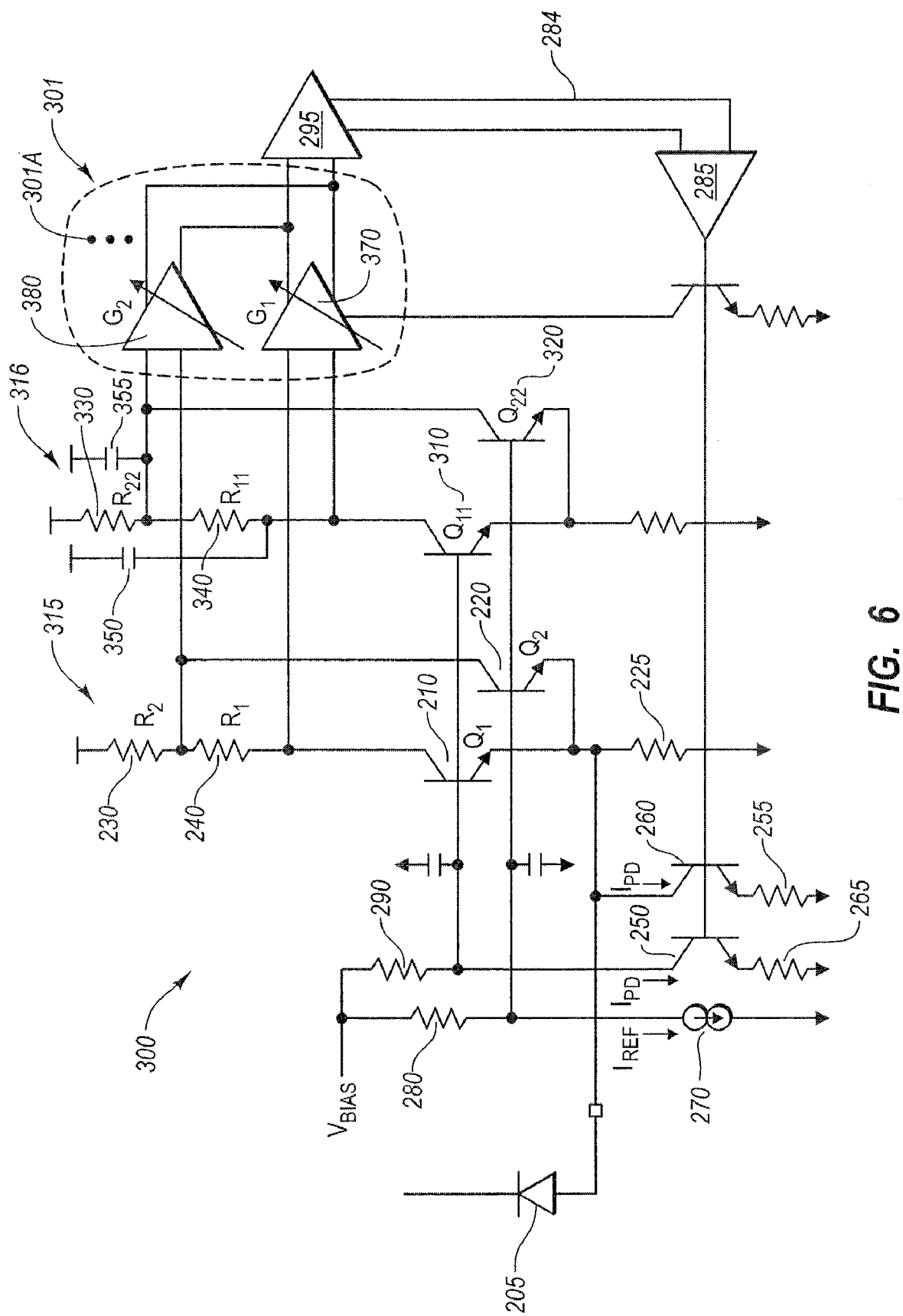
FIG. 6 is a block diagram of a transimpedance amplifier in accordance with the principles of the present invention.

Turning now to FIG. 6, an alternative embodiment of a linear transimpedance amplifier in accordance with the principles of the present invention is designated at 300. As illustrated, linear transimpedance amplifier (TIA) 300 also utilizes a common base topography with a feedback circuit that provides DC cancellation as previously described. Generally, the linear TIA 300 includes an amplifier that may include one or more multiplexed stages. The DC offset or component is sensed by the feedback and eliminated from the input signal. Advantageously, this helps to control the gain linear TIA 300. As mentioned previously, it is desirable that none of the gain stages of linear TIA 300 clip or otherwise cause distortion to the signal provided at the output of linear TIA 300.

As illustrated, linear TIA 300 includes an input gain stage 315, buffer stage 295 and DC cancellation feedback loop 284 that are similar to these stages as previously described in relation to FIG. 5. As shown, input stage 315 includes transistors 210, 220, 250, and 260 and resistors 225, 230, 240, 280 and 290 that function in the manner previously described in relation to FIG. 5. In other words, the DC cancellation feedback loop 284 uses the average photodiode current Ipd 275 to control the flow of current through transistors 210 and 220 as previously described.

Returning to FIG. 6, linear TIA 300 may also include a dummy input stage 316. Dummy input stage 316 may be implemented to balance the signals input into the following amplifier stages. In addition, the various elements of dummy stage 316 are implemented to provide a differential input into the following amplifier stages. Since transistors 310 and 320 are not connected to photodiode 205, they do not provide any photodiode modulation current to the following amplifier stages. As will be appreciated by those of skill in the art, dummy stage 316 includes capacitors 350 and 355 to prevent any power supply noise from adversely affecting the linearity of linear TIA 300. Note that some embodiments of linear TIA 300 do not implement the dummy stage 316.

Linear transimpedance amplifier 300 also includes a multiplexed amplifier stage 301 consisting of a low optical power amplification stage or path 370 (G1) and a high optical power amplification stage or path 380 (G2). Note that in some embodiments, the multiplexed amplifier stage 301 may include more that two amplification paths as circumstances warrant as illustrated by ellipses 301A. Advantageously, the implementation of a multiplexed amplifier stage 301 prevents any one stage or path of the multiplexed amplifier stage from becoming saturated and thereby adversely affecting the linearity of linear TIA 300 as will be explained in more detail to follow.

In operation, the average photodiode current Ipd 275 is used to monitor the strength of the optical power using DC cancellation feedback loop 284. When Ipd 275 is lower than fixed reference current Iref 270, the voltage at the base of transistor 210 is larger than at the base of transistor 220 and the modulation current from photodiode 205 flows through transistor 210 and is amplified as Imod×(resistor 230+resistor 240). This signal is then provided to low optical power amplifier stage or path 370 where it is further amplified. The signal may then be provided to buffer stage 295 and output from linear TIA 300.

As optical power continues to increase, the amplitude of Ipd 275 will also increase. As mentioned, this rising optical power may drive low optical power amplifier stage or path 370 into saturation. However, as previously described, when Ipd 275 becomes larger than Iref 270, the voltage at the base of transistor 220 becomes larger than the voltage at the base of transistor 210 and the photodiode modulation current Imod begins to flow through transistor 220 and is amplified as Imod×resistor 230. This signal is then provided to high optical power amplifier stage or path 380 where it is further amplified. The signal may then be provided to buffer stage 295 and output from linear transimpedance amplifier 300. Note that because only high optical signals are amplified by high optical power amplifier stage or path 380, this gain stage or path may be configured to provide only a small amount of amplification. As will be appreciated, a signal at high optical power typically needs less amplification than a signal at low optical power. Advantageously, implementing high optical power amplifier stage or path 380 to provide a small amount of amplification helps to prevent signal distortion at high optical power.

Implementing high optical power amplifier stage or path 380 also substantially removes resistor 230 from the signal path. As was discussed in relation to FIG. 5 above, removing resistor 230 from the signal path typically helps to improve the linearity of TIA 300.

As mentioned, multiplexed amplifier stage 301 may include one or more amplifier stages or paths in addition to amplifier stage or path 370 and 380. As will be appreciated after reading this description, in some embodiments the optical power may be such that high optical power amplifier stage or path 380 begins to saturate or otherwise cause signal distortion. In such embodiments, one or more additional amplifier stages may be added to multiplexed amplifier stage 301 in order to preserve the linearity of TIA 300. The additional amplifier stages or paths may be turned on and/or off by the use of DC cancellation feedback loop as previously described.

Figure 7:
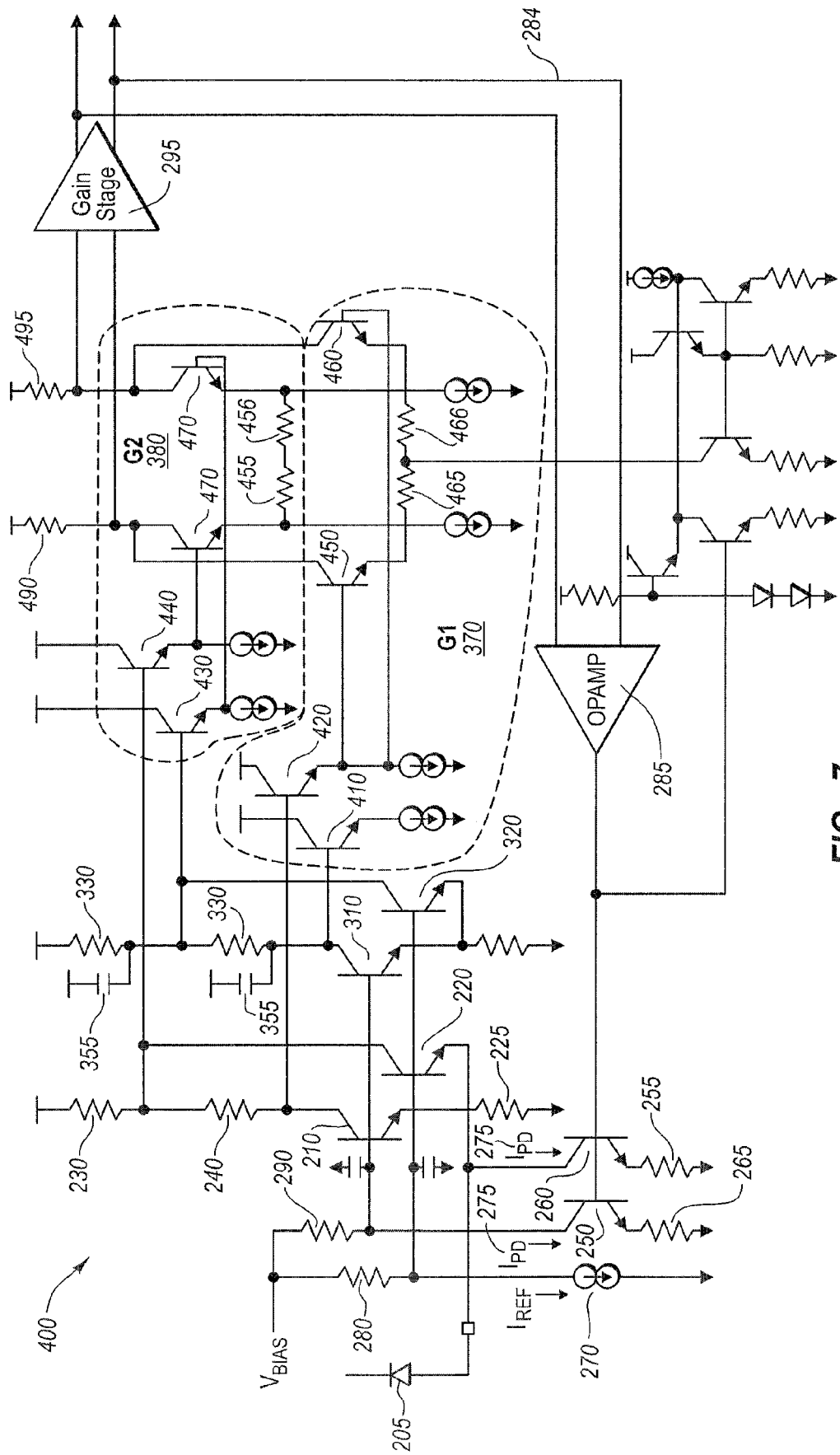
FIG. 7 is a block diagram of a transimpedance amplifier in accordance with the principles of the present invention.

Referring now to FIG. 7, a specific embodiment of a linear transimpedance amplifier (TIA) 400 is illustrated. As illustrated, linear TIA 400 includes a first stage 315 and dummy stage 316 as previously described in relation to FIGS. 5 and 6. Accordingly, the operation of these functions will not be described in further detail.

FIG. 7 further illustrates a specific embodiment of DC cancellation feedback loop 284. Specifically, the illustrated embodiment includes an op-amp 285 and various transistors and resistors connected as illustrated. The specific embodiment of DC cancellation feedback loop 284 operates as previously described above. As will be appreciated by those of skill in the art after having read this description, the illustrated embodiment of DC cancellation feedback loop 284 is one of multiple configurations that may be used to practice the principles of the present invention.

FIG. 7 also illustrates specific embodiments of low optical power amplifier stage or path 370 and high optical power amplifier stage or path 380. Specifically, low optical power amplifier stage or path 370 includes an emitter-follower pair of transistors 410 and 420 that are coupled to a differential pair of transistors 450 and 460. In operation, transistors 410 and 420 are driven by transistors 210 and 310 respectively at low optical power. In turn, transistors 410 and 420 drive the differential pair of transistors 450 and 460. Accordingly, the photodiode modulation current flowing through transistor 210 is amplified by the transistors of low optical power amplifier stage or path 370 and resistors 465, 466 490 and 495 as is known in the art. The photodiode modulation current is then provided to gain stage 295.

High optical power amplifier stage or path 380 includes an emitter-follower pair of transistors 430 and 440 that are coupled to a differential pair of transistors 470 and 480. In operation, transistors 430 and 440 are driven by transistors 220 and 320 respectively at high optical power. In turn, transistors 410 and 420 drive the differential pair of transistors 450 and 460. Accordingly, the photodiode modulation current flowing through transistor 220 is amplified by the transistors of high optical power amplifier stage or path 380 and resistors 455, 456 490 and 495 as is known in the art. The photodiode modulation current is then provided to gain stage 295. As will be apparent to one of skill in the art after having read this description, the principles of the present invention encompass a TIA 400, as well as a TIA 200 and a TIA 300, that include additional modules and/or components not illustrated in the figures as circumstances warrant.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A linear transimpedance amplifier with two or more gain paths, the linear transimpedance amplifier comprising:
   a forward transimpedance circuit that receives an input signal from an optical device that converts an optical signal to the input signal, wherein the forward transimpedance circuit generates a linear output signal, and wherein the forward transimpedance circuit includes a first gain path and a second gain path, the first gain path configured to amplify the input signal when the first gain path is at a lower input impedance relative to the second gain path and the second gain path configured to amplify the input signal when the second gain path is at a lower input impedance relative to the first gain path; and
   a feedback circuit that includes:
      a first circuit that detects a low frequency component of the output signal; and
      a second circuit that is driven by the low frequency component of the output signal and is connected with the forward transimpedance circuit such that the second circuit uses an average optical device current at least partially control when the input signal is amplified by the first gain path and when the input signal is amplified by the second gain path.

2. The transimpedance amplifier in accordance with claim 1, wherein the first gain path comprises:
   a transistor having a first terminal configured to be coupled to a bias voltage, a second terminal coupled to a first and second resistor in series, and a third terminal configured to be coupled to the optical device for receiving the input signal, the third terminal also being coupled to the second circuit, wherein the input signal is amplified by the series combination of the first and second series resistors before being provided to one or more gain stages and/or an output node when the second circuit causes the input signal to be amplified by the first gain stage.

3. The transimpedance amplifier in accordance with claim 1, wherein the second gain path comprises:
   a transistor having a first terminal configured to be coupled to a bias voltage and to a fixed reference current, a second terminal coupled between a first and second series resistors, and a third terminal configured to be coupled to the optical device for receiving the input signal, the third terminal also being coupled to the second circuit, wherein the second circuit causes the input signal to be substantially amplified by second resistor before being provided to one or more gain stages and/or an output node when the fixed reference current is greater than the average optical device current.

4. The transimpedance amplifier in accordance with claim 1, wherein the second circuit comprises:
   a first transistor having a first terminal coupled to the first circuit, a second terminal coupled to a ground, and a third terminal coupled to the forward transimpedance circuit, wherein the first transistor is configured to source or sink the average optical device current; and
   a second transistor having a first terminal coupled to the first circuit and to the first terminal of the first transistor, a second terminal coupled to a ground, and a third terminal coupled to the forward transimpedance circuit, wherein the second transistor is configured to mirror the average optical device current in the first transistor and to provide the mirrored average optical device current to the first gain path.

5. The transimpedance amplifier in accordance with claim 4, wherein the second circuit further comprises a fixed reference current source coupled to the forward transimpedance circuit and configured to provide the fixed reference current to the second gain path.

6. The transimpedance amplifier in accordance with claim 1, wherein the first circuit includes at least a low frequency operational amplifier.

7. The transimpedance amplifier in accordance with claim 1, wherein there is substantially no clipping or other distortion of the linear output signal such that the linear output signal is configured to be provided to an Electronic Dispersion Compensation (EDC) module or device.

8. A linear transimpedance amplifier comprising:
   an input stage that receives an input current signal from an optical device that converts an optical signal to the input current signal, wherein the input stage includes at least a first gain path that generates a first output voltage from the input current signal and a second gain path that generates a second output voltage from the input current signal, the first gain path generating the first output voltage when the first gain path is at a lower input impedance relative to the second gain path and wherein the second gain path generates the second output voltage when the second gain path is at a lower input impedance relative to the first gain path;
   a multiplexed gain stage, wherein the multiplexed gain stage includes at least a first amplifier stage configured to amplify the first output voltage to produce a first amplified signal and a second amplifier stage configured to amplify the second output voltage to produce a second amplified signal; and
   a feedback circuit that includes:
      a first circuit that detects a low frequency component of the first and/or second amplified signals; and
      a second circuit that is driven by the low frequency component of the output signal and is connected with the input stage such that the second circuit uses an average optical device current to at least partially control when first gain path generates the first output voltage and when the second gain path generates the second output voltage.

9. The transimpedance amplifier in accordance with claim 8, wherein the input stage is a common base configuration.

10. The transimpedance amplifier in accordance with claim 8, wherein the multiplexed gain stage includes more than two gain stages and/or the input stage includes more than two gain paths.

11. The transimpedance amplifier in accordance with claim 8, wherein the first gain path of the input stage comprises:
   a transistor having a first terminal configured to be coupled to a bias voltage, a second terminal coupled to a first and second resistor in series, and a third terminal configured to be coupled to the optical device for receiving the input current signal, the third terminal also being coupled to the second circuit, wherein the input current signal is amplified by the series combination of the first and second series resistors to generate the first output voltage when the second circuit causes the input current signal to be amplified by the first gain stage.

12. The transimpedance amplifier in accordance with claim 8, wherein the second gain path of the input stage comprises:
   a transistor having a first terminal configured to be coupled to a bias voltage and to a fixed reference current, a second terminal coupled between a first and second series resistors, and a third terminal configured to be coupled to the optical device for receiving the input current signal, the third terminal also being coupled to the second circuit, wherein the second circuit causes the input current signal to be substantially amplified by second resistor when the fixed reference current is greater than the average optical device current.

13. The transimpedance amplifier in accordance with claim 8, wherein the second circuit comprises:
   a first transistor having a first terminal coupled to the first circuit, a second terminal coupled to a ground, and a third terminal coupled to input stage, wherein the first transistor is configured to source or sink the average optical device current; and
   a second transistor having a first terminal coupled to the first circuit and to the first terminal of the first transistor, a second terminal coupled to a ground, and a third terminal coupled to the input stage, wherein the second transistor is configured to mirror the average optical device current in the first transistor and to provide the mirrored average optical device current to the first gain path.

14. The transimpedance amplifier in accordance with claim 13, wherein the second circuit further comprises a fixed reference current source coupled to the input stage and configured to provide the fixed reference current to the second gain path.

15. The transimpedance amplifier in accordance with claim 8, wherein the first amplifier stage of the multiplexed amplifier stage comprises:
   an emitter follower pair of transistors configured to receive the first output voltage from the first gain path of the input stage; and
   a differential pair of transistors that are driven by the emitter follower pair and that are configured to provide the first amplified signal to one or more gain stages and/or an output node.

16. The transimpedance amplifier in accordance with claim 8, wherein the second amplifier stage of the multiplexed amplifier stage comprises:
   an emitter follower pair of transistors configured to receive the second output voltage from the second gain path of the input stage; and
   a differential pair of transistors that are driven by the emitter follower pair and that are configured to provide the second amplified signal to one or more gain stages and/or an output node.

17. The transimpedance amplifier in accordance with claim 8, wherein the first circuit includes at least a low frequency operational amplifier.

18. The transimpedance amplifier in accordance with claim 8, wherein there is substantially no clipping or other distortion of the linear output signals such that the linear output signals are configured to be provided to an Electronic Dispersion Compensation (EDC) module or device.

19. The transimpedance amplifier in accordance with claim 8, wherein the first gain path of the input stage generates the first output voltage at low optical power received by the optical device and the second gain path of the input stage generates the second output voltage at high optical power received by optical device.

20. The transimpedance amplifier in accordance with claim 8, wherein the input stage further includes a dummy input stage configured to balance signal input into one or more following gain stages.

* * * * *

UNITED STATES PATENT AND TRADEMARK OFFICE
CERTIFICATE OF CORRECTION

PATENT NO. : 7,525,391 B2
APPLICATION NO. : 11/842586
DATED : April 28, 2009
INVENTOR(S) : Denoyer It is certified that error appears in the above-identified patent and that said Letters Patent is hereby corrected as shown below:

Column 1
Line 29, after "optic" remove [a]
Line 54, change "rate" to --rates--

Column 2
Line 10, change "shunt feedback resistor 11" to --shunt feedback resistor 12--
Line 13, change "11" to --12--

Column 4
Line 62, after "when" insert --the--

Column 6
Line 56, change "component 130" to --component 132--

Column 7
Line 58, after "gain" insert --of--

Column 8
Line 23, change "that" to --than--

Column 9
Line 40, change "466 490" to --466, 490--
Line 53, change "456 490" to --456, 490--

Column 10
Line 21, after "current" insert --to--
Line 42, change "between a first" to --between first--

Column 11
Line 63, change "between a first" to --between first--

Signed and Sealed this
Twenty-second Day of March, 2011

David J. Kappos
*Director of the United States Patent and Trademark Office*